(12) United States Patent
Huang et al.

(10) Patent No.: US 11,990,577 B2
(45) Date of Patent: May 21, 2024

(54) LIGHT-EMITTING DEVICE AND METHOD FOR MANUFACTURING THE SAME

(71) Applicant: XIAMEN SANAN OPTOELECTRONICS TECHNOLOGY CO., LTD., Xiamen (CN)

(72) Inventors: Shaohua Huang, Xiamen (CN); Xiaoqiang Zeng, Xiamen (CN); Jianfeng Yang, Xiamen (CN); Canyuan Zhang, Xiamen (CN)

(73) Assignee: QUANZHOU SAN'AN SEMICONDUCTOR TECHNOLOGY CO., LTD., Nanan (CN)

( * ) Notice: Subject to any disclaimer, the term of this patent is extended or adjusted under 35 U.S.C. 154(b) by 442 days.

(21) Appl. No.: 17/465,075

(22) Filed: Sep. 2, 2021

(65) Prior Publication Data

US 2022/0005993 A1    Jan. 6, 2022

Related U.S. Application Data

(63) Continuation-in-part of application No. PCT/CN2019/082703, filed on Apr. 15, 2019.

(51) Int. Cl.
*H01L 33/62* (2010.01)
*H01L 25/075* (2006.01)
(Continued)

(52) U.S. Cl.
CPC .......... *H01L 33/62* (2013.01); *H01L 25/0753* (2013.01); *H01L 25/167* (2013.01);
(Continued)

(58) Field of Classification Search
CPC ............. H01L 25/0753; H01L 25/0756; H01L 25/167; H01L 27/15; H01L 27/153;
(Continued)

(56) References Cited

U.S. PATENT DOCUMENTS 9,673,254 B2 *  6/2017  Oh .................... H01L 27/156

FOREIGN PATENT DOCUMENTS

| CN | 201829524 U | 5/2011 |
| CN | 102339913 A | 2/2012 |
| CN | 102354699 A | 2/2012 |

OTHER PUBLICATIONS

International Search Report for PCT/CN2019/082703, Form PCT/ISA/210, dated Dec. 23, 2019.

* cited by examiner

*Primary Examiner* — Cheung Lee
(74) *Attorney, Agent, or Firm* — MUNCY, GEISSLER, OLDS & LOWE, PC

(57) ABSTRACT

A light-emitting device includes a lead frame having a first surface on which a patterned conductive layer is provided, and a light-emitting element. The light-emitting element includes an insulating substrate formed on the first surface, a plurality of light-emitting units formed on the insulating substrate, at least one first electrode, at least one second electrode and at least a pair of bonding wires. The first and second electrodes are respectively placed in electrical connection with a first one and a second one of the light-emitting units, and are disposed outward of the light-emitting units. Each of the pair of bonding wires is disposed to electrically connect a respective one of the first and second electrodes to the patterned conductive layer.

20 Claims, 7 Drawing Sheets

(51) Int. Cl.
*H01L 25/16* (2023.01)
*H01L 33/64* (2010.01)

(52) U.S. Cl.
CPC .... *H01L 33/647* (2013.01); *H01L 2933/0066* (2013.01); *H01L 2933/0075* (2013.01)

(58) Field of Classification Search
CPC ..... H01L 27/156; H01L 33/00; H01L 33/005; H01L 33/36; H01L 33/382; H01L 33/387; H01L 33/48; H01L 33/62; H01L 33/64; H01L 33/644; H01L 33/647; H01L 2933/0016; H01L 2933/0066; H01L 2933/0075

See application file for complete search history.

LIGHT-EMITTING DEVICE AND METHOD FOR MANUFACTURING THE SAME

CROSS-REFERENCE TO RELATED APPLICATION

This application is a bypass continuation-in-part (CIP) application of PCT International Application No. PCT/CN2019/082703, filed on Apr. 15, 2019. The entire content of the international patent application is incorporated herein by reference.

FIELD

The disclosure relates to a semiconductor device, and more particularly to a light-emitting device and a manufacturing method thereof.

BACKGROUND

Conventional incandescent light bulbs and fluorescent lamps are gradually replaced by light-emitting diodes (LEDs), as LEDs are advantageous in terms of low power consumption, long service life, etc. Therefore, LEDs have been widely used in solid-state lighting and employed in various fields, such as traffic lights and signals, backlight module, illuminated street light, and medical appliances.

Referring to FIG. 1, a conventional high voltage chip on board (COB) light source includes a circuit board 110 having a top surface on which a patterned conductive layer 111 is provided, a plurality of LED vertical chips 120, and a plurality of connecting wires 130. The LED vertical chips 120 are disposed on the top surface, and are electrically connected to the conductive layer 111 through the connecting wires 130. Further referring to FIG. 2, each of the LED vertical chips 120 includes a bottom electrode 1242, a conductive substrate 1210, a metal bonding layer 1220, a first semiconductor layer 1231, an active layer 1232, a second semiconductor layer 1233, and a top electrode 1241 that are sequentially disposed on the circuit board 110 in such order. With the limitation of the conductive substrate 1210, two adjacent ones of the LED vertical chips 120 usually have to be spaced apart from each other by a distance of not less than 50 μm in order to be electrically isolated from each other. As such, a total light-emitting area of the COB light source can hardly be reduced, which is unfavorable for improving optical power density. In addition, packaging of the COB light source might be met with difficulty in achieving desired thermoelectric separation.

SUMMARY

Therefore, an object of the disclosure is to provide a light-emitting device and a method for manufacturing the same that can alleviate at least one of the drawbacks of the prior art.

According to the disclosure, the light-emitting device includes a lead frame having a first surface on which a patterned conductive layer is provided, and a light-emitting element. The light-emitting element includes an insulating substrate, a plurality of light-emitting units, at least one first electrode, at least one second electrode, and at least one pair of bonding wires. The insulating substrate is formed on the first surface of the lead frame. The light-emitting units are formed on the insulating substrate opposite to the lead frame. Each of the light-emitting units includes a first semiconductor layer, an active layer and a second semiconductor layer that are sequentially disposed on the insulating substrate in such order. The first electrode is placed in electrical connection with the first semiconductor layer of a first one of the light-emitting units, and is disposed outward of the light-emitting units. The second electrode is placed in electrical connection with the second semiconductor layer of a second one of the light-emitting units, and is disposed outward of the light-emitting units. Each of the bonding wires is disposed to electrically connect a respective one of the first electrode and the second electrode to the patterned conductive layer.

According to the disclosure, the method for manufacturing the light-emitting device includes the steps of:
(a) providing a lead frame which has a first surface on which a patterned conductive layer is formed;
(b) preparing a light-emitting element which includes:
an insulating substrate;
a plurality of light-emitting units which are formed on the insulating substrate, and each of which includes a first semiconductor layer, a second semiconductor layer, and an active layer disposed between the first and second semiconductor layers;
at least one first electrode which is placed in electrical connection with the first semiconductor layer of a first one of the light-emitting units, and which is disposed outward of the light-emitting units; and
at least one second electrode which is placed in electrical connection with the second semiconductor layer of a second one of the light-emitting units, and which is disposed outward of the light-emitting units;
(c) mounting the light-emitting element on the first surface of the lead frame, such that the insulating substrate is in contact with the lead frame; and
(d) connecting the first electrode and the second electrode to the patterned conductive layer through at least one pair of bonding wires, respectively.

BRIEF DESCRIPTION OF THE DRAWINGS

Other features and advantages of the disclosure will become apparent in the following detailed description of the embodiment(s) with reference to the accompanying drawings, of which.

Figure 8:
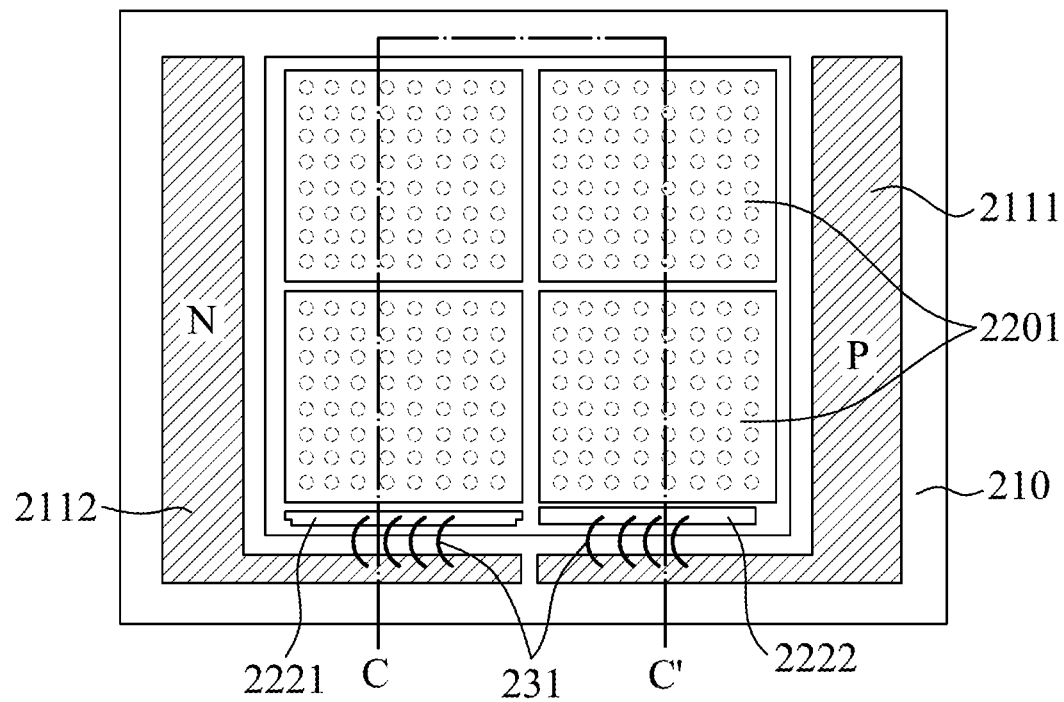
Figure 9:
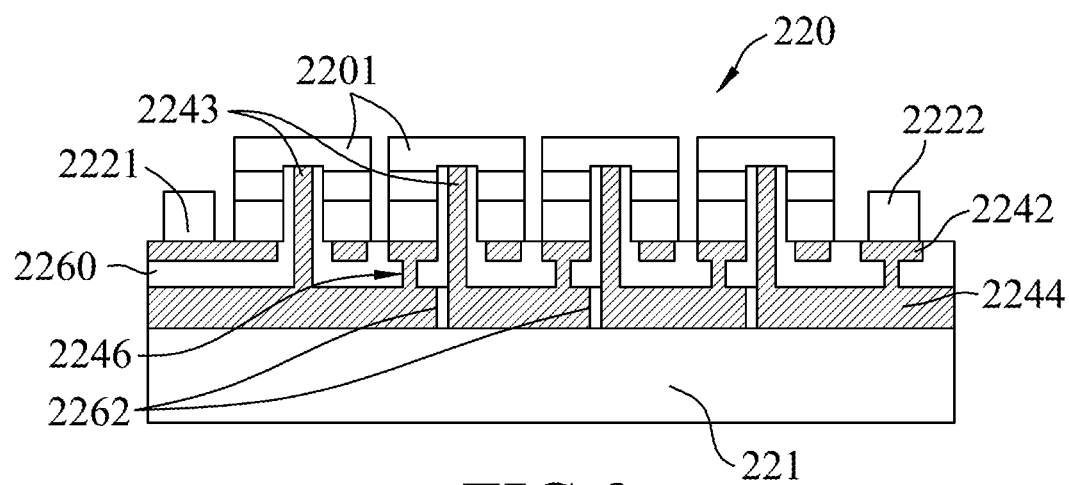
Figure 10:
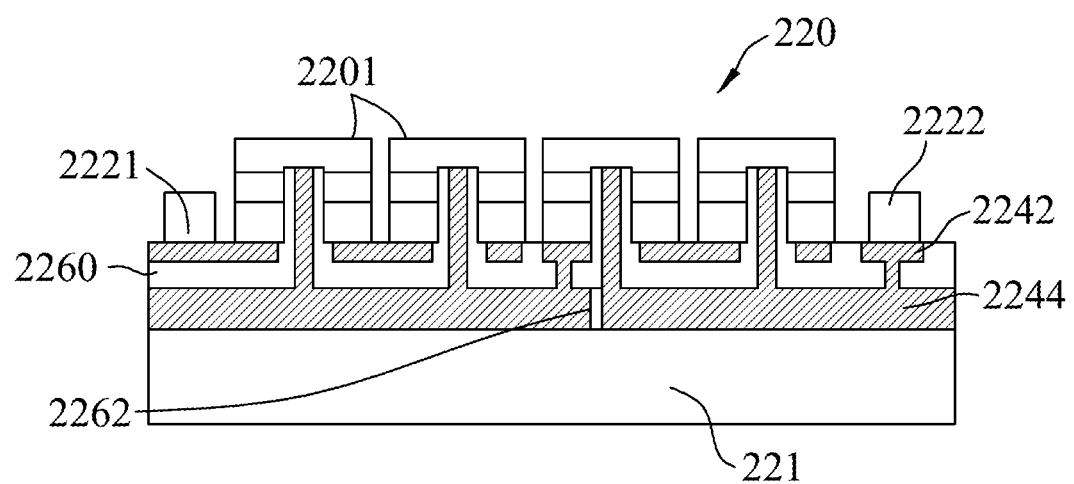

FIG. is a schematic top view illustrating a variation of the first embodiment of the light-emitting device according to the disclosure;

FIG. 8 is a schematic top view illustrating a second embodiment of the light-emitting device according to the disclosure;

FIG. 9 is a schematic sectional view taken along line C-C' shown in FIG. 8, illustrating a light-emitting element of the second embodiment; and FIG. 10 is a schematic sectional view illustrating a light-emitting element in a variation of the second embodiment.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIGS. 3 to 6, a first embodiment of a light-emitting device according to this disclosure includes a lead frame 210 and a light-emitting element 220.

The lead frame 210 has a first surface 210A (front surface) and a second surface (back surface) opposite to the first surface 210A. A patterned conductive layer 2110 is provided on the first surface 210A. The first surface 210A of the lead frame 210 has a first region 2101 on which the light-emitting element 220 is mounted, and a second region 2102 on which the patterned conductive layer 2110 is provided. The first region 2101 may be located at a periphery of the second region 2102.

The light-emitting element 220 includes an insulating substrate 221, a plurality of light-emitting units 2201, at least one first electrode 2221, at least one second electrode 2222 and at least one pair of bonding wires 231.

The insulating substrate 221 is formed on the first surface 210A of the lead frame 210, and is configured to support the light-emitting units 2201. The insulating substrate 221 may have a thickness not smaller than 50 μm, and not greater than 200 μm. In certain embodiments, the thickness of the insulating substrate 221 ranges from 50 μm to 100 μm, such as 90 μm. In other embodiments, the thickness of the insulating substrate 221 ranges from 100 μm to 150 μm, such as 120 μm, or 130 μm. In yet other embodiments, the thickness of the insulating substrate 221 ranges from 150 μm to 2000 μm, such as 180 μm. The insulating substrate 221 may be made of a light-transmissive material (e.g., sapphire, ceramic, etc.), or a highly reflective material. In certain embodiments, the insulating substrate 221 may be made of a heat-dissipating material. That is, the insulating substrate 221 may serve as a heat-dissipating substrate.

The light-emitting units 2201 are formed on the insulating substrate 221 opposite to the lead frame 210, and are attached to the insulating substrate 221, so that the physical structure of the light-emitting units 2201 is intact. In certain embodiments, the light-emitting units 2201 may be light-emitting diodes (LED). In certain embodiments, each of the light-emitting units 2201 having a thin film structure is first formed on a growth substrate, and then transferred to the insulating substrate 221, followed by removing the growth substrate. Each of the light-emitting units 2201 has a top surface and a bottom surface that are respectively distal from and proximal to the lead frame 210, wherein the top surface serves as a light-emitting surface S11 of the light-emitting device. The light-emitting units 2201 are electrically isolated from the first region 2101 of the lead frame 210 (i.e., electrically isolated from each other due to the insulating substrate 221), and are electrically connected to each other through the bonding wires 231 and the patterned conductive layer 2110. With such configuration, a high voltage COB structure may be formed, and the light-emitting units 2201 can be operated under high current density. In certain embodiments, the light-emitting units 2201 are configured to be operated at a working current density of greater than 3 A/mm$^2$, such as 4 A/mm$^2$ or A/mm$^2$. Two adjacent ones of the light-emitting units 2201 define therebetween, a clearance 240 which is not greater than 30 μm, such as 20 μm, 10 μm or 8 μm, so as to be conducive for enhancing power density of the light-emitting device.

The patterned conductive layer 2110 may include a plurality of conductive segments 2111, 2112, 2113, which are spaced apart from each other. The number and arrangement of the conductive segments 2111, 2112, 2113 may be determined according to the number and arrangement of the light-emitting units 2201. In certain embodiments, the number of the light-emitting units 2201 is n, and the number of the conductive segments 2111, 2112, 2113 is n+1, so as to ensure each of the light-emitting units 2201 is electrically connected to the patterned conductive layer through the bonding wires 231. For example, in this embodiment, four light-emitting units 2201 and five conductive segments (including one first conductive segment 2111, one second conductive segment 2112 and three third conductive segments 2113) are illustrated. Each of the light-emitting units 2201 is disposed to electrically connect two corresponding ones of the conductive segments 2111, 2112, 2113. Specifically, the first conductive segment 2111 serves as a first soldering region, which includes a first conductive main part 2111A for electrically connecting to an external electric source and a first conductive extension part 2111B for electrically connecting to one of the light-emitting units 2201. The second conductive segment 2112 serves as a second soldering region, which includes a second conductive main part 2112A for electrically connecting to an external electric source and a second conductive extension part 2112B for electrically connecting to another one of the light-emitting units 2201. Each of the three third conductive segments 2113 is configured to electrically connect to two adjacent ones of the light-emitting units 2201.

Each of the light-emitting units 2201 includes a first semiconductor layer 2211, an active layer 2212 and a second semiconductor layer 2213 that are sequentially disposed on the insulating substrate 221 in such order. The first semiconductor layer 2211 and the second semiconductor layer 2213 may respectively be a p-type semiconductor layer or an n-type semiconductor layer, or vice versa. Each of the first and second semiconductor layers 2211, 2213 may be made of a nitride-based semiconductor material represented by $Al_xIn_yGa_{(1-x-y)}$, where $0 \leq x \leq 1$, $0 \leq y \leq 1$, and $0 \leq x+y \leq 1$, but is not limited thereto. Alternatively, the first and second semiconductor layers 2211, 2213 may be made of a GaAs-based semiconductor material or a GaP-based semiconductor material (such as AlGaInP). The active layer 2212 may include a multiple-quantum-well (MQW) structure, which may be made of materials including, but are not limited to, InGaN/GaN, GaN/AlGaN, Galas/AlGaAs, InGaP/GaP, GaP/AlGaP, etc.

The at least one first electrode 2221 is placed in electrical connection with the first semiconductor layer 2211 of a first one of the light-emitting units 2201. The at least one second electrode 2222 is placed in electrical connection with the second semiconductor layer 2213 of a second one of the light-emitting units 2201. Each of the first and second electrodes 2221, 2222 is disposed outward of the light-emitting units 2201. That is, a projection of each of the first and second electrodes 2221, 2222 on the insulating substrate 221 is located outside of a projection of the semiconductor layered structure on the insulating substrate 221. Each of the first and second electrodes 2221, 2222 are located at the same side of the insulating substrate 221 opposite to the lead frame 210.

Each of the bonding wires 231 is disposed to electrically connect a respective one of the first electrode 2221 and the second electrode 2222 to the patterned conductive layer 2110. In certain embodiments, the first and second electrodes 2221, 2222 are flush with one another as measured from the insulating substrate 221.

In certain embodiments, the light-emitting element 220 includes a plurality of the first electrodes 2221, a plurality of the second electrodes 2222, and a plurality of the pairs of bonding wires 231. In such case, one of the first electrodes 2221 and a corresponding one of the second electrodes 2222 are electrically connected to the first and second semiconductor layers 2211, 2213 of a corresponding one of the light-emitting units 2201, respectively, and are electrically connected to the patterned conductive layer 2110 through a corresponding pair of the bonding wires 231.

In this embodiment, each of the first electrodes 2221 and each of the second electrodes 2222 are electrically connected to the first and second semiconductor layers 2211, 2213 of a respective one of light-emitting units 2201, respectively, and are electrically connected to the patterned conductive layer 2110 through a corresponding pair of the bonding wires 231.

In certain embodiments, at least one of the light-emitting units 2201 is connected to the insulating substrate 221 through a conductive structure 2240. When the light-emitting device is in operation, thermal energy easily accumulates in the light-emitting units 2201. The conductive structure 2240 is configured to direct and dissipate a heat generated from the light-emitting units 2201 to the insulating substrate 221, and then to the lead frame 210. The conductive structure 2240 may also serve as an electrically connecting structure which is disposed to electrically connect the second semiconductor layer 2213 of the at least one of the light-emitting units 2201 to the second electrode 2222.

In certain embodiments, the conductive structure 2240 is a multi-layered structure. For example, the conductive structure 2240 may include a first electrically connecting layer 2241 and a second electrically connecting layer 2242 that are separated and insulated from each other through an insulating layer 2260. The first and second electrically connecting layers 2241, 2242 electrically connect to the first electrode 2221 and the second electrode 2222, respectively. The first and second electrically connecting layers 2241, 2242 may be simultaneously formed through one step (such as a patterning process) so as to have identical thickness and material, and to be flush with each other, which are conducive for the subsequent formation of the first and the second electrodes 2221, 2222 having the same height thereon.

The conductive structure 2240 may further include a third electrically connecting layer 2244 which is in contact with the insulating substrate 221. The third electrically connecting layer 2244 is separated and insulated from the first electrically connecting layer 2241 through the insulating layer 2260.

In this embodiment, at least one of the light-emitting units 2201 includes a plurality of recesses. Each of the recesses extends through the first semiconductor layer 2211 and the active layer 2212 to access the second semiconductor layer 2213. The third electrically connecting layer 2244 includes a plurality of first extension pieces 2243 that are in electrical contact with the second semiconductor layer 2213 through the recesses. The third electrically connecting layer 2244 further includes a plurality of second extension pieces 2245 (only one is shown in figures) that are configured to be in contact with the second electrically connecting layer 2242.

A total contact area between the second semiconductor layer 2213 and the first extension pieces 2243 may account for not smaller than 1.5% of a total surface area of an upper surface of the second semiconductor layer 2213 opposite to the active layer 2212, and may be adjusted according to practical needs. For example, the total contact area between the second semiconductor layer 2213 and the first extension pieces 2243 accounts for 2.3% to 2.8%, 2.8% to 4% or 4% to 6% of the total surface area of the upper surface of the second semiconductor layer 2213. By increasing the total contact area, the light-emitting device of this disclosure can exhibit an improved heat dissipating performance, and thus may resolve heat dissipating issue of the light-emitting device when operated under high power density. Considering the first extension pieces 2243 with a relatively small diameter may have an increased thermal resistance that is not in linear scale, each of the first extension pieces 2243 may have a diameter of not smaller than 15 μm, such as 32 μm to 40 μm. In certain embodiments, the first extension pieces 2243 are evenly distributed so as to achieve a further improved current spreading and heat dissipating properties, which favours operation of the light-emitting device under high current density. In certain embodiments, each of the first extension pieces 2243 has a diameter ranging from 34 μm to 36 μm, and the first extension pieces 2243 are arranged at a density of 20 to 25 pieces/mm². The insulating layer 2260 may further include an insulating element 2262 which is configured to electrically insulate two adjacent ones of the light-emitting units 2201 from each other.

The conductive structure 2240 may include a metallic material. In some embodiments, each of the first and the second electrically connecting layers 2241, 2242 may include a respective one of contact sublayers which are respectively in contact with the first and second electrodes 2221, 2222 and which are made of a relatively stable material, such as titanium, platinum, gold, chromium, indium tin oxide or titanium tungsten alloy. Each of the first and the second electrically connecting layers 2241, 2242 may further include a first reflective sublayer that is disposed on the contact sublayer opposite to the first and second electrodes 2221, 2222, and a metal barrier sublayer that covers the first reflective sublayer. The first reflective sublayer may be made of a highly reflective metallic material, such as silver or aluminum, and is configured to reflect the light emitted from the light-emitting unit 2201. The diffusion blocking sublayer may be made of the aforementioned relatively stable metallic material, and is configured to prevent the diffusion of the reflective metallic material. The first extension pieces 2243 of the third electrically connecting layer 2244 may be made of a reflective material such as aluminum, chromium or silver.

In some embodiments, the first reflective sublayer of each of the first electrically connecting layer 2241 and the second electrically connecting layer 2242 may be spaced apart from the light-emitting surface S11 by a distance not greater than 10 μm (such as 4 μm to 8 μm) and may be spaced apart from the active layer 1232 by a distance not greater than 1 μm, so as to shorten a light transmitting path within the light-emitting unit 2201, and to increase the amount of light that is emitted from the active layer 2212 and that exits from the light-emitting surface S11. In certain embodiments, the light-emitting units 2201 are configured to permit a light to be emitted from the light-emitting units 2201 at a light-emitting angle of not greater than 130°. In other embodiments, the light-emitting units 2201 are configured to permit a light to be emitted from the light-emitting units 2201 at a light-emitting angle ranging from 110° to 120°, such as 113°, 115°, or 118°.

In certain embodiments, each of the first extension pieces 2243 may include a second reflective sublayer which is spaced apart from the light-emitting surface S11 by a distance that is smaller than half of a thickness of each of the light-emitting units 2201. For example, the distance between the second reflective sublayer and the light-emitting surface S11 may be not greater than 20 μm, such as 7 μm to 12 μm, e.g., 8 μm, 9 μm, or 10 μm.

In certain embodiments, the first reflective sublayer of each of the first and second electrically connecting layers 2241, 2242 is made of silver, and the second reflective sublayer of the third electrically connecting layer 2244 may be made of aluminum. The second reflective sublayer made of aluminum is configured to form an ohmic contact with the second semiconductor layer 2213, and may cooperate with the first reflective sublayer of each of the first and second electrically connecting layers 2241, 2242 to more effectively reflect light emitted from the light-emitting units 2201.

In certain embodiments, the light-emitting element 220 may further include a bonding layer (not shown in figures) that is configured to bond the third electrically connecting layer 2244 to the insulating substrate 221. The bonding layer may be made of a metallic material, which is conducive to dissipation of heat generated from the light-emitting units 2201 to the insulating substrate 221.

In other embodiments, in order to lower electrical resistance between the first electrically connecting layer 2241 and the first semiconductor layer 2211, a transmissible current spreading layer (not shown in figures) may be further provided therebetween.

The light-emitting device may further include an encapsulant 250 which encapsulates the light-emitting units 2201 onto the lead frame 210.

Figure 1:
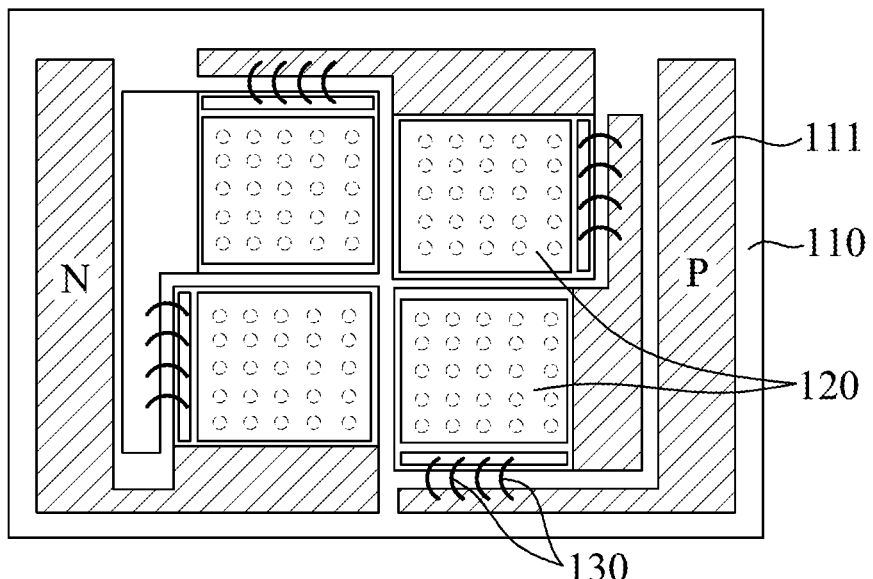
FIG. 1 is a top schematic view illustrating a conventional high voltage chip on board (COB) light source.
Figure 2:
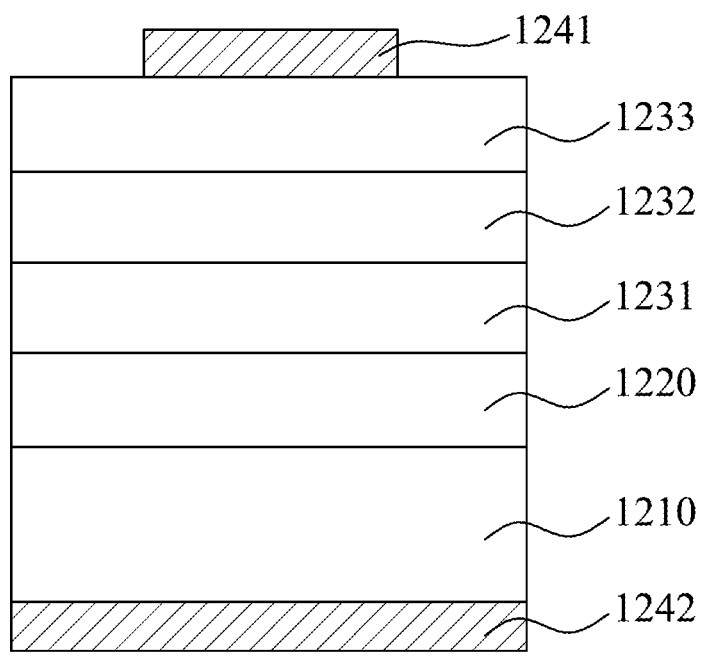
FIG. 2 is a sectional schematic view illustrating one of LED vertical chips of the conventional high voltage COB light source shown in FIG. 1.
Figure 3:
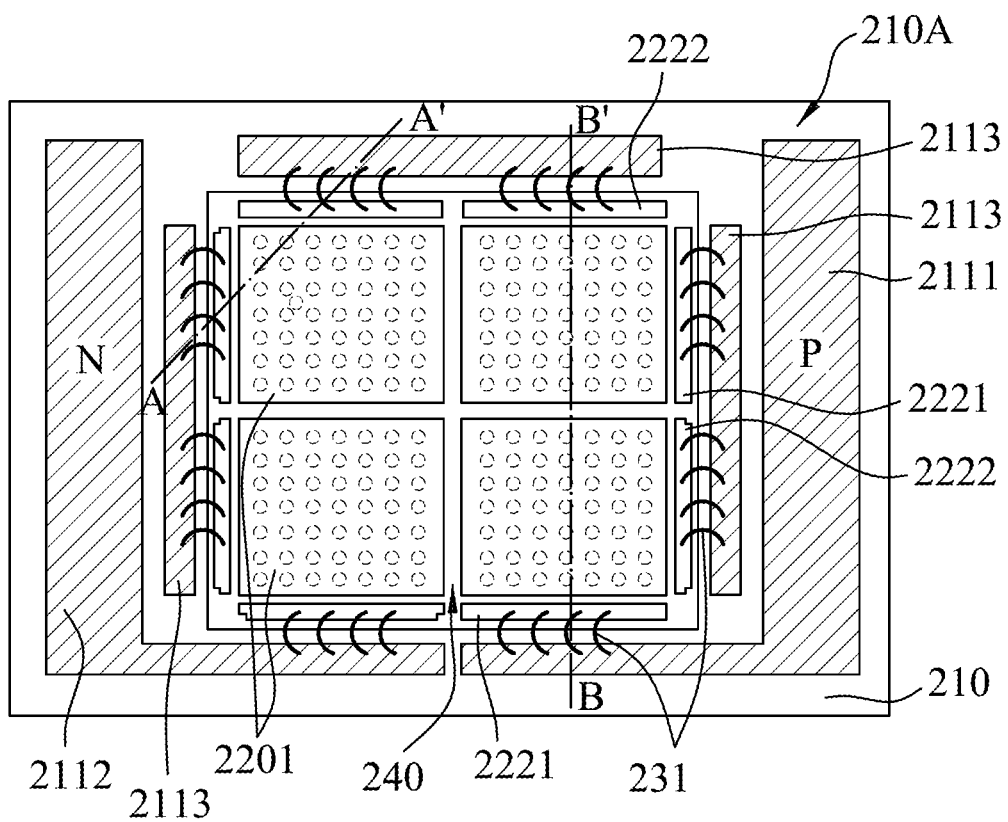
FIG. 3 is a schematic top view illustrating a first embodiment of a light-emitting device according to the disclosure.
Figure 4:
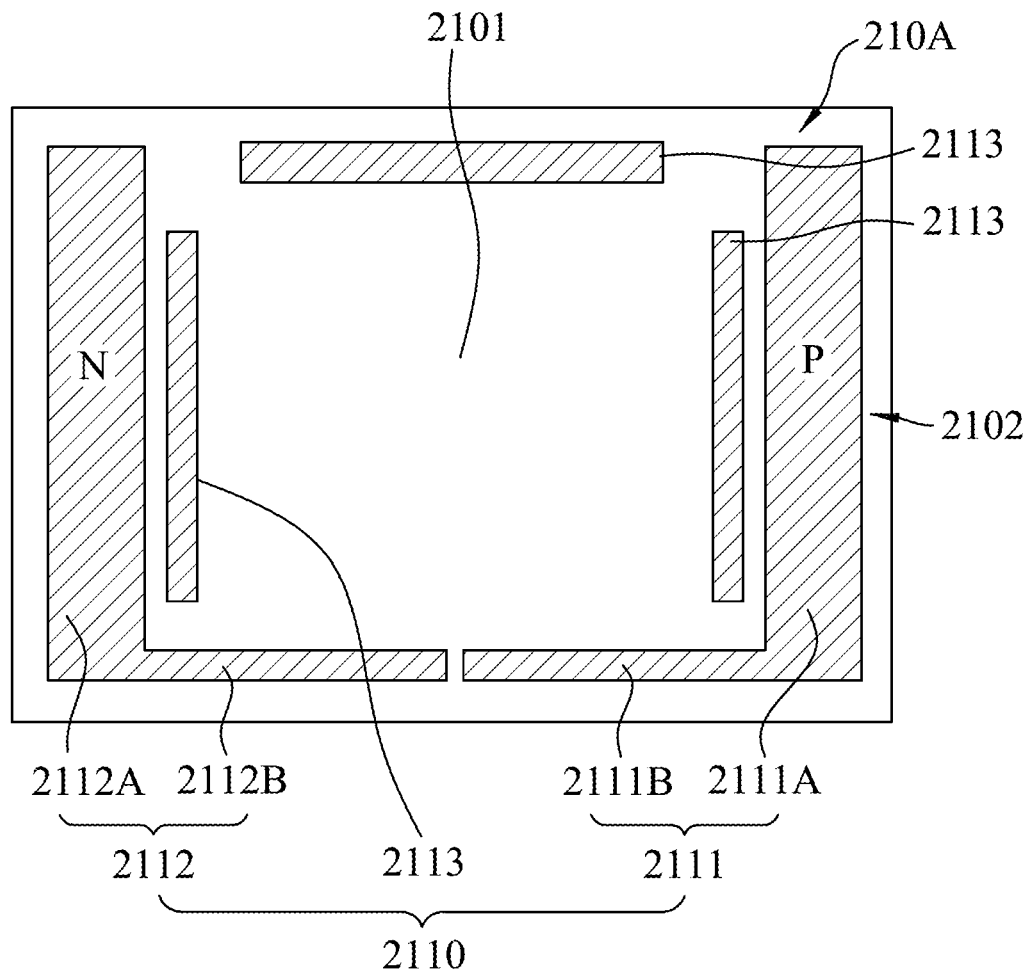
FIG. 4 is a schematic top view illustrating a lead frame of the first embodiment of the light-emitting device according to the disclosure.
Figure 5:
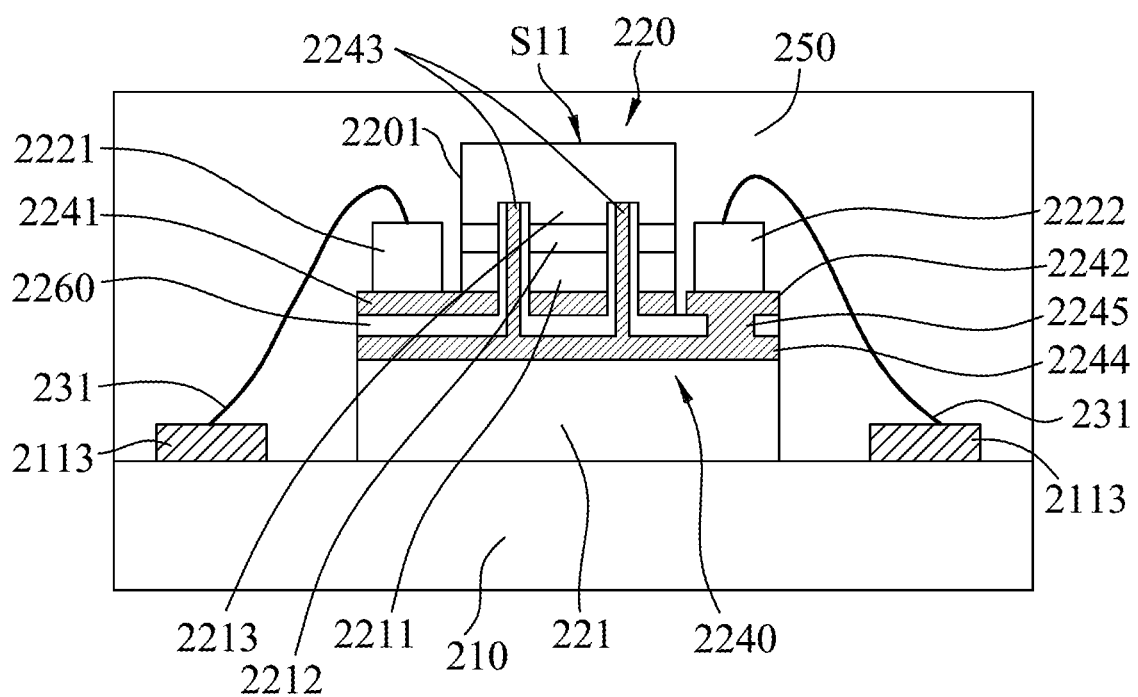
FIG. 5 is a schematic sectional view taken along line A-A' shown in FIG. 3.
Figure 6:
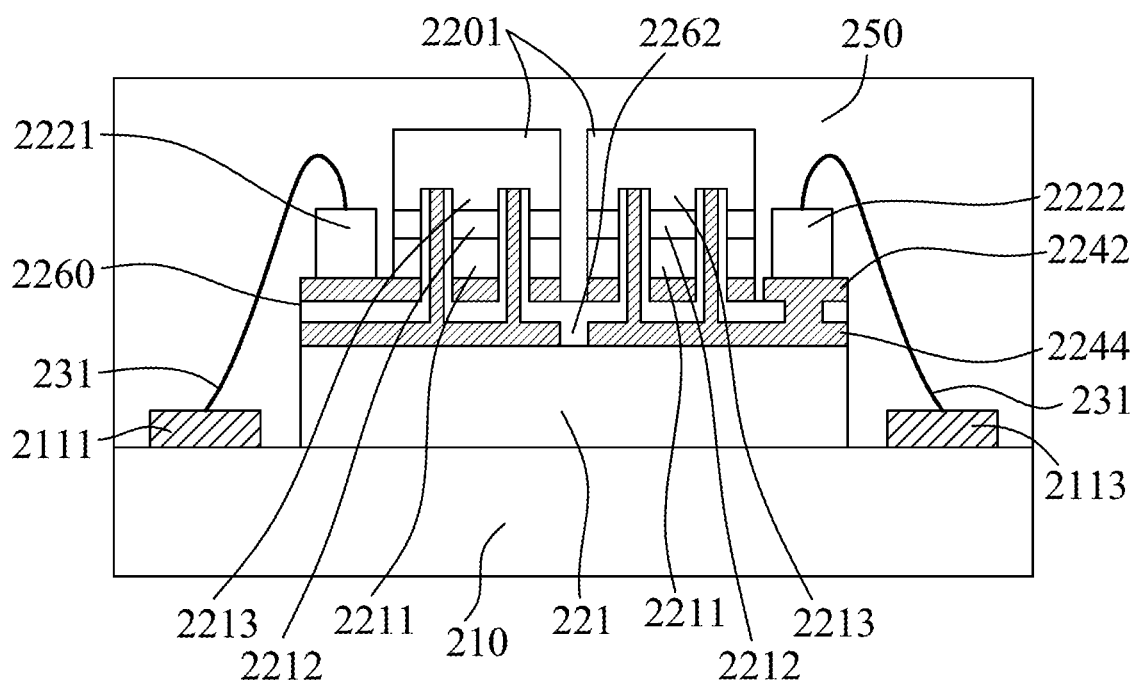
FIG. 6 is a schematic sectional view taken along line B-B' shown in FIG. 3.
Figure 7:
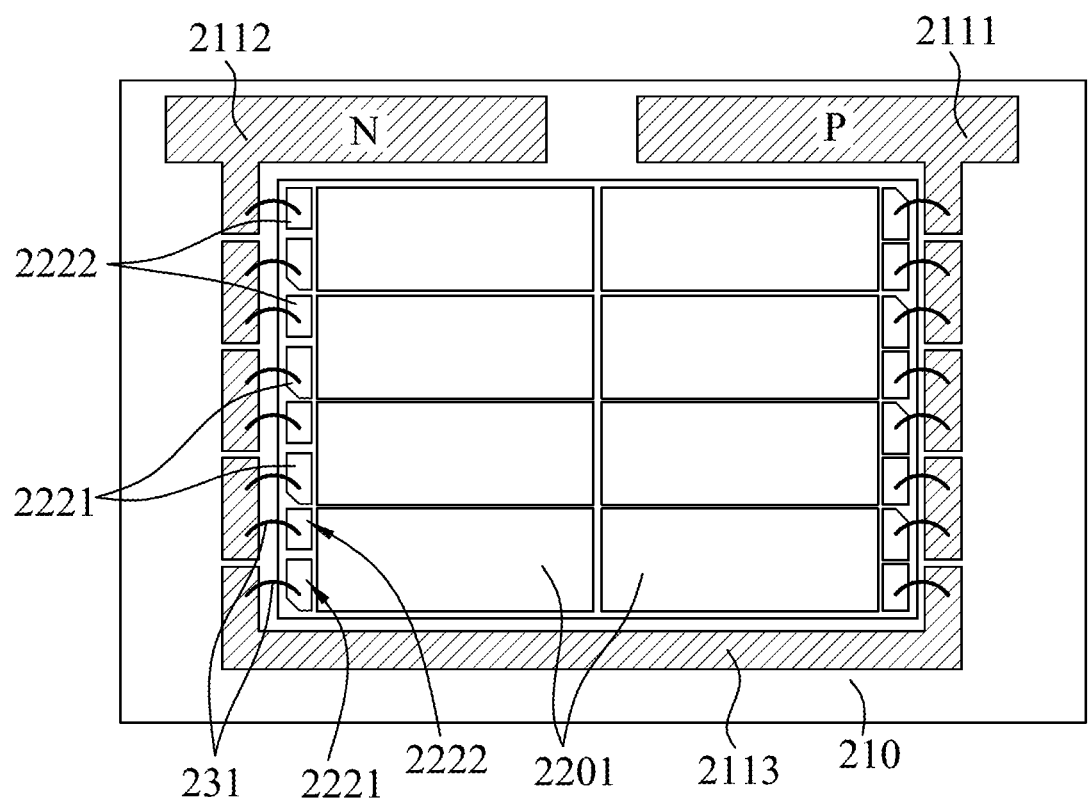

It should be noted that arrangements of the first electrodes 2221 and the second electrodes 2222 (such as a pad) are flexible, as long as they are electrically isolated from each other, and the current spreading property of each of the light-emitting units 2201 is not altered. For example, referring to FIG. 7, in a variation of the first embodiment of the light-emitting device, for each of the light-emitting units 2201, the first electrode 2221 and the second electrode 2222 are placed on a same side of the light-emitting unit 2201.

Referring to FIGS. 8 and 9, a second embodiment of the light-emitting device according to the disclosure is generally similar to the first embodiment, except for the following differences. In the second embodiment, the light-emitting element 220 includes one first electrode 2221 and one second electrode 2222, and the patterned conductive layer 2110 includes two conductive segments (i.e., one first conductive segment 2111 and one second conductive segment 2112). The light-emitting units 2201 are electrically connected in series through the conductive structure 2240. The first conductive segment 2111 and the second conductive segment 2112 are configured to be electrically connected to a first one and a last one of the light-emitting units 2201 through the bonding wires 231. The first electrode 2221 is in electrical connection with the first semiconductor layer 2211 of the first one of the serially connected light-emitting units 2201, and the second electrode 2222 is in electrical connection with the second semiconductor layers 2213 of the last one of the serially connected light-emitting units 2201.

In addition, the third electrically connecting layer 2244 further includes a plurality of third extension pieces 2246 that are configured to be in contact with the first semiconductor layers 2211 of the light-emitting units 2201 subsequent to the first one of the light-emitting units 2201. The insulating layer 2260 includes multiple insulating elements 2262 formed in the third electrically connecting layer 2244, such that for each of the light-emitting units 2201 subsequent to the first one of the light-emitting units 2201, the first extension piece 2243 is electrically insulated from the third extension piece 2246.

Referring to FIG. 10, in a variation of the second embodiment, the light-emitting units 2201 are configured as a series-parallel circuit through the conductive structure 2240.

According to this disclosure, a method for manufacturing the abovementioned light-emitting device is also provided. The method includes the following steps (a) to (d).

In step (a), the lead frame 210 is provided, on which the patterned conductive layer (2110) is formed on the first surface 210A of the lead frame 210.

Specifically, the first surface 210A of the lead frame 210 has the first region 2101 on which the light-emitting element 220 is to be mounted in the subsequent step, and the second region 2102 on which the patterned conductive layer 2110 is formed.

Next, in step (b), the light-emitting element 220 is provided. The light-emitting element 220 includes the insulating substrate 221, the light-emitting units 2201 which is formed on the insulating substrate 221, and the first and second electrodes 2221, 2222 which are placed in electrical connection with the first semiconductor layer 2211 of a first one of the light-emitting units 2201, and with the second semiconductor layer 2213 of a second one of the light-emitting units 2201, respectively. The first and second electrodes 2221, 2222 are disposed outward of the light-emitting units 2201.

Then, in step (c), the light-emitting element 220 is mounted on the first surface 210A of the lead frame 210, such that the insulating substrate 221 is in contact with the lead frame 210. In certain embodiments, the light-emitting units 2201 are mounted to be electrically isolated from the first region 2101 of the lead frame 210.

In step (d), each of the first and second electrodes 2221, 2222 are connected to the patterned conductive layer 2110 through the at least one pair of bonding wires 231, respectively. In certain embodiments, the light-emitting units 2201 are electrically connected to each other through the pair of bonding wires 231 and the patterned conductive layer 2110.

In certain embodiments, at least one of the light-emitting units 2201 is connected to the insulating substrate 221 through the conductive structure 2240, so as to direct a heat generated from the light-emitting element 220 to the insulating substrate 221.

To conclude, by including the insulating substrate 221 on which the light-emitting units 2201 are formed, the space between two adjacent ones of the light-emitting units 2201 can be reduced, such that the light-emitting device of this disclosure can have a decreased light-emitting area, thereby exhibiting an improved optical power output density. In addition, heat generated from the light-emitting units 2201 can be effectively dissipated by the insulating substrate 221, so as to achieve a desirable thermoelectric separation.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting device, comprising:
    a lead frame having a first surface on which a patterned conductive layer is provided; and
    a light-emitting element including:
        an insulating substrate formed on said first surface of said lead frame,
        a plurality of light-emitting units formed on said insulating substrate opposite to said lead frame, each of said light-emitting units including a first semiconductor layer, an active layer and a second semiconductor layer that are sequentially disposed on said insulating substrate in such order,
        at least one first electrode which is placed in electrical connection with said first semiconductor layer of a first one of said light-emitting units, and which is disposed outward of said light-emitting units; and
        at least one second electrode which is placed in electrical connection with said second semiconductor layer of a second one of said light-emitting units, and which is disposed outward of said light-emitting units,
    wherein said light-emitting element further includes at least one pair of bonding wires, each of which is disposed to electrically connect a respective one of said first electrode and said second electrode to said patterned conductive layer.

2. The light-emitting device of claim 1, wherein at least one of said light-emitting units is connected to said insulating substrate through a conductive structure, so as to direct a heat generated from said light-emitting element to said insulating substrate.

3. The light-emitting device of claim 2, wherein said conductive structure is disposed to electrically connect said second semiconductor layer of said at least one of said light-emitting units to said second electrode.

4. The light-emitting device of claim 3, wherein said conductive structure includes a metallic material.

5. The light-emitting device of claim 1, wherein said first surface of said lead frame has a first region on which said light-emitting element is mounted, and a second region on which said patterned conductive layer is provided, said light-emitting units being electrically isolated from said first region of said lead frame, and being electrically connected to each other through said bonding wires and said patterned conductive layer.

6. The light-emitting device of claim 5, wherein said light-emitting element includes a plurality of said first electrodes, a plurality of said second electrodes, and a plurality of said pairs of said bonding wires, and wherein one of said first electrodes and a corresponding one of said second electrodes are electrically connected to said first and second semiconductor layers of a corresponding one of said light-emitting units, respectively, and are electrically connected to said patterned conductive layer through a corresponding pair of said bonding wires.

7. The light-emitting device of claim 1, wherein two adjacent ones of said light-emitting units define therebetween a clearance which is not greater than 30 μm.

8. The light-emitting device of claim 1, wherein said light-emitting units are configured to permit a light to be emitted therefrom at a light-emitting angle of not greater than 130°.

9. The light-emitting device of claim 1, wherein said light-emitting units are configured to permit a light to be emitted therefrom at a light-emitting angle ranging from 110° to 120°.

10. The light-emitting device of claim 1, wherein said light-emitting units are configured to be operated at a working current density of greater than 3 $A/mm^2$.

11. The light-emitting device of claim 1, wherein said patterned conductive layer includes a plurality of conductive segments which are spaced apart from each other, and each of said light-emitting units is disposed to electrically connect two corresponding ones of said conductive segments.

12. The light-emitting device of claim 11, wherein when the number of said light-emitting units is n, the number of said conductive segments is n+1.

13. The light-emitting device of claim 1, wherein at least one of said light-emitting units includes a plurality of recesses, each of which extends through said first semiconductor layer and said active layer to access said second semiconductor layer, said light-emitting element further includes a conductive structure which includes a plurality of first extension pieces that are in electrical contact with said second semiconductor layer through said recesses.

14. The light-emitting device of claim 13, wherein a total contact area between said second semiconductor layer and said first extension pieces accounts for not smaller than 1.5% of a total surface area of an upper surface of said second semiconductor layer opposite to said active layer.

15. The light-emitting device of claim 14, wherein said total contact area between said second semiconductor layer and said first extension pieces accounts for 4% to 6% of said total surface area of said upper surface of said second semiconductor layer.

16. The light-emitting device of claim 1, wherein said insulating substrate serves as a heat-dissipating substrate.

17. A method for manufacturing a light-emitting device, comprising the steps of:
    (a) providing a lead frame which has a first surface on which a patterned conductive layer is formed;
    (b) preparing a light-emitting element which includes:
        an insulating substrate;
        a plurality of light-emitting units formed on the insulating substrate, each of the light-emitting units including a first semiconductor layer, a second semiconductor layer, and an active layer disposed between the first and second semiconductor layers;
        at least one first electrode which is placed in electrical connection with the first semiconductor layer of a first one of the light-emitting units, and which is disposed outward of the light-emitting units; and
        at least one second electrode which is placed in electrical connection with the second semiconductor layer of a second one of the light-emitting units, and which is disposed outward of the light-emitting units;

(c) mounting the light-emitting element on the first surface of the lead frame, such that the insulating substrate is in contact with the lead frame; and (d) connecting the first electrode and the second electrode to the patterned conductive layer through at least one pair of bonding wires, respectively.

18. The method of claim 17,
wherein the first surface of the lead frame has a first region on which the light-emitting element is mounted, and a second region on which the patterned conductive layer is formed;
wherein in step (c), the light-emitting units on the insulating substrate are mounted to be electrically isolated from the first region of the lead frame; and
wherein in step (d), the light-emitting units are electrically connected to each other through said bonding wires and the patterned conductive layer.

19. The method of claim 18, wherein the light-emitting element includes a plurality of the first electrodes, a plurality of the second electrodes, and a plurality of the pairs of the bonding wires, and wherein one of the first electrodes and a corresponding one of the second electrodes are electrically connected to the first and second semiconductor layers of a corresponding one of the light-emitting units, respectively, and are electrically connected to the patterned conductive layer through a corresponding pair of the bonding wires.

20. The method of claim 17, wherein at least one of the light-emitting units is connected to the insulating substrate through a conductive structure, so as to direct a heat generated from the light-emitting element to the insulating substrate.

* * * * *